US007883351B2

(12) United States Patent
Kusaki et al.

(10) Patent No.: US 7,883,351 B2
(45) Date of Patent: Feb. 8, 2011

(54) SOCKET FOR MOUNTING ELECTRONIC COMPONENT (75) Inventors: Kenji Kusaki, Minato-ku (JP); Kiyoshi Asai, Shinagawa-ku (JP)

(73) Assignees: Sony Corporation, Tokyo (JP); SMK Corporation, Tokyo (JP)

( * ) Notice: Subject to any disclaimer, the term of this patent is extended or adjusted under 35 U.S.C. 154(b) by 0 days.

(21) Appl. No.: 12/305,074

(22) PCT Filed: Jun. 13, 2007

(86) PCT No.: PCT/JP2007/061906

§ 371 (c)(1),
(2), (4) Date: Dec. 16, 2008

(87) PCT Pub. No.: WO2007/145250

PCT Pub. Date: Dec. 21, 2007

(65) Prior Publication Data

US 2009/0181561 A1 Jul. 16, 2009

(30) Foreign Application Priority Data

Jun. 16, 2006 (JP) .............................. 2006-167150

(51) Int. Cl.
H01R 13/62 (2006.01)

(52) U.S. Cl. ..................................... 439/330
(58) Field of Classification Search ................ 439/330, 439/680, 357, 71
See application file for complete search history.

(56) References Cited

U.S. PATENT DOCUMENTS

| 7,147,481 B2* | 12/2006 | Yang ............................. 439/71 |
| 7,241,160 B2* | 7/2007 | Yang ........................... 439/330 |
| 2003/0218873 A1* | 11/2003 | Eromaki et al. ............. 361/816 |
| 2005/0176288 A1 | 8/2005 | Ohsawa et al. |
| 2005/0208790 A1 | 9/2005 | Asai |
| 2005/0215087 A1 | 9/2005 | Asai et al. |

(Continued)

FOREIGN PATENT DOCUMENTS

JP 63 71545 5/1988

(Continued)

*Primary Examiner*—Phuong K Dinh
(74) *Attorney, Agent, or Firm*—Oblon, Spivak, McClelland, Maier & Neustadt, L.L.P.

(57) ABSTRACT

A socket for mounting an electronic component that can connect an electronic component always in a correct orientation is provided. Socket-side engaging parts (9) are provided at a plurality of places of a peripheral wall (3) of a socket housing (5) having an electronic component accommodating part (4) that is surrounded by the peripheral wall (3) raised from the four side parts of a quadrangle-shape bottom plate (2). The socket-side engaging parts (9) include elastic fixing pieces whose fixing protrusions (9a) at the tip ends are locked in the bottom parts of respective locking recessed parts of the peripheral wall of the electronic component (6). An electronic component is held in the electronic component accommodating part (4) by these socket-side engaging parts (9). In one side part (3d) of opposing two side parts (3b), (3d) of the peripheral wall (3) of the four side parts (3a), (3b), (3c), (3d) of the socket housing (5), plural socket-side engaging parts (9) are arranged closer to the both end sides thereof with an interval in between, and in the remaining other side part (3b), one or plural socket-side engaging parts are arranged closer to the center side thereof adjacent to each other.

8 Claims, 5 Drawing Sheets

U.S. PATENT DOCUMENTS

| | | |
|---|---|---|
| 2005/0215117 A1 | 9/2005 | Asai et al. |
| 2005/0215118 A1 | 9/2005 | Asai et al. |
| 2006/0051986 A1 | 3/2006 | Asai et al. |
| 2006/0098969 A1 | 5/2006 | Asai et al. |

FOREIGN PATENT DOCUMENTS

| | | |
|---|---|---|
| JP | 10-199635 | 7/1998 |
| JP | 2003 68415 | 3/2003 |
| JP | 2003-92168 | 3/2003 |
| JP | 2004-241225 | 8/2004 |
| JP | 2005 150052 | 6/2005 |
| JP | 2006 79871 | 3/2006 |
| JP | 2006 100189 | 4/2006 |

* cited by examiner

SOCKET FOR MOUNTING ELECTRONIC COMPONENT

TECHNICAL FIELD

The present invention relates to a socket for mounting an electronic component, such as a sensor module such as a camera module and the like used in a mobile phone, etc., a semiconductor element, etc., to a printed wiring board in a state of being electrically connected to the printed wiring board.

BACKGROUND ART

Conventionally, an electronic apparatus such as a mobile phone, etc. is provided with a printed wiring board inside thereof, and an electronic component such as a sensor module, other semiconductor elements, etc. is mounted to the printed wiring board. In this case, because the electronic component that is easily affected by heat cannot be directly mounted by means of soldering, such component is connected to the printed wiring board using a socket for mounting an electronic component.

A socket for mounting an electronic component includes a socket housing having an electronic component accommodating part that is surrounded by a peripheral wall raised from the four sides of a quadrangle-shape bottom plate, and a plurality of contacts protruding from the bottom plate of the socket housing and having elastic contact pieces that elastically contact terminal parts in the bottom part of an electronic component such as a sensor module, a semiconductor element, etc. in the electronic component accommodating part, and by causing the electronic component accommodating part to hold the electronic component such as a sensor module, a semiconductor element, etc., respective terminal parts of the electronic component contact the elastic contact pieces of the plurality of contacts, and thereby the electronic component is electrically connected to the printed wiring board via these contacts.

The socket for mounting an electronic component also includes in the peripheral wall of the socket housing a plurality of socket-side engaging parts protruding to the inside of the electronic component accommodating part and having elastic fixing pieces whose fixing protrusions at the tip ends are locked in the bottom parts of locking recessed parts of a peripheral wall of the electronic component, and the electronic component is held in the electronic component accommodating part by these socket-side engaging parts.

As the plurality of socket-side engaging parts of conventional sockets for mounting an electronic component, there have been known the engaging parts that are arranged one by one symmetrically at the positions closer to the corners of respective side parts of a quadrangular peripheral wall raised from the four side parts of a quadrangle-shape bottom plate (see, for example, FIG. 2 of Japanese Unexamined Patent Application Publication No. 2005-150052 published by Japanese Patent Office), and the engaging parts that are arranged, two pieces by two pieces with an interval between the two pieces, at respective four side parts of a quadrangular peripheral wall (see, for example, FIG. 2 of Japanese Unexamined Patent Application Publication No. 2006-79871 published by Japanese Patent Office).

However, with such symmetrical arrangement of these socket-side engaging parts for the socket for mounting an electronic component, when inserting an electronic component into the electronic component accommodating part of the socket housing, even when the electronic component is inserted 180 degrees reversed, it results in that the electronic component is locked in respective socket-side engaging parts, so that there has been a problem that the connection always in the correct orientation cannot be guaranteed.

The object of the present invention is to provide a socket for mounting an electronic component that can connect an electronic component always in the correct orientation.

DISCLOSURE OF THE INVENTION

The first invention is applied to a socket for mounting an electronic component with a configuration including a socket housing having an electronic component accommodating part that is surrounded by a peripheral wall raised from the four side parts of a quadrangle-shape bottom plate, a plurality of contacts protruding from the bottom plate of the socket housing and having elastic contact pieces elastically contacting a plurality of terminal parts in a bottom part of an electronic component in the electronic component accommodating part to be electrically connected, and socket-side engaging parts provided at a plurality of places of the peripheral wall of the socket housing and configured to engage with electronic-component-side engaging parts of an electronic component to be inserted into the electronic component accommodating part to prevent coming-off of the electronic component. Further, the invention is applied to a socket for mounting an electronic component having a configuration that the socket-side engaging parts are engaged with the electric component engaging parts and thereby the electronic component is prevented from coming off the electronic component accommodating part.

As the configuration, one or plural socket-side engaging parts of a plurality of the socket-side engaging parts are arranged in each of opposing two side parts of the peripheral wall of the four side parts of the socket housing in positions that are not symmetrical with respect to the center of the electronic component accommodating part of the socket housing. It is characterized in that due to such configuration, when the electronic component is inserted in a direction other than a specified orientation, the socket-side engaging parts are not engaged with the electronic component engaging parts.

According to the first invention, only when the electronic component is inserted into the electronic component accommodating part in a correct orientation, respective socket-side engaging parts are engaged with the electronic component engaging parts and thereby locking is effected, and when the electronic component is inserted otherwise, locking is not effected and the electronic component is pushed out by the elasticity of the elastic contact pieces of the plurality of contacts, so that it is known that the electronic component was inserted in the wrong orientation. Therefore, according to the present invention, it is possible to insert the electronic component into the socket for mounting an electronic component always in the correct orientation to be electrically connected.

The second invention is characterized in that in addition to the configuration of the first invention, plural socket-side engaging parts are arranged closer to the both end sides with an interval in between in one side part of the opposing two side parts of the peripheral wall of the four side parts of the socket housing, and one or plural socket-side engaging parts are arranged closer to the center side in the remaining other side part of the opposing two side parts.

According to the second invention, the socket-side engaging parts are arranged substantially in a triangle arrangement, and it is possible to lock the electronic component in a stable posture.

The third invention is characterized in that in addition to the configuration of the second invention, the number of the plural socket-side engaging parts that are arranged closer to the both end sides in one side part of the opposing two side parts of the peripheral wall is two, and the number of the socket-side engaging parts that are arranged closer to the center side in the other side part of the opposing two side parts is two.

According to the third invention, the locking state of the electronic component becomes more stable.

The fourth invention is characterized in that in addition to the configuration of the first invention, the electronic component-side engaging parts of the peripheral wall of the electronic component are locking recessed parts in a shape made by recessing the peripheral wall, and the socket-side engaging parts are elastic fixing pieces that are provided in the peripheral wall of the socket housing, protrude to the inside of the electronic component accommodating part, respectively, and whose fixing protrusions at the tip ends are locked in the locking recessed parts of the peripheral wall of the electronic component.

According to the fourth invention, if the electronic component is inserted in the orientation other than a specified one, the electronic component is hard to be inserted because of the elastic fixing pieces, and when the electronic component is inserted in the correct orientation, insertion is easy and yet, after having been inserted, the elastic fixing pieces are locked in the engaging recessed parts of the peripheral wall of the electronic component and thereby the electronic component is put in a stable locked state.

BEST MODE FOR CARRYING OUT THE INVENTION

Next, a concrete example of a socket for mounting an electronic component according to an embodiment of the present invention is described in detail while referring to drawings.

Figure 1:
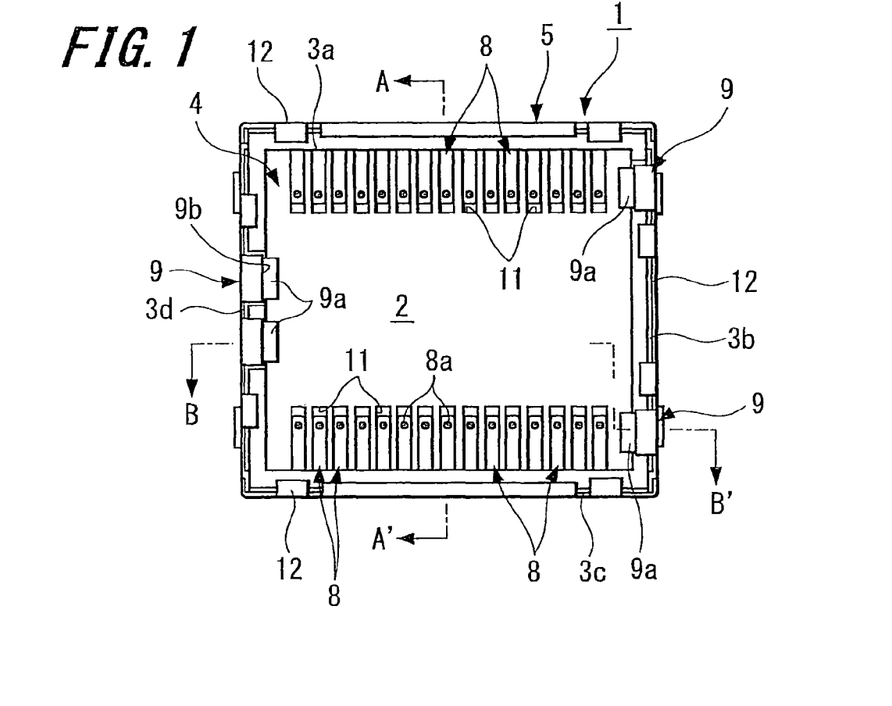
FIG. 1 is a front view of an example of a socket for mounting an electronic component according an embodiment of the present invention.
Figure 2:
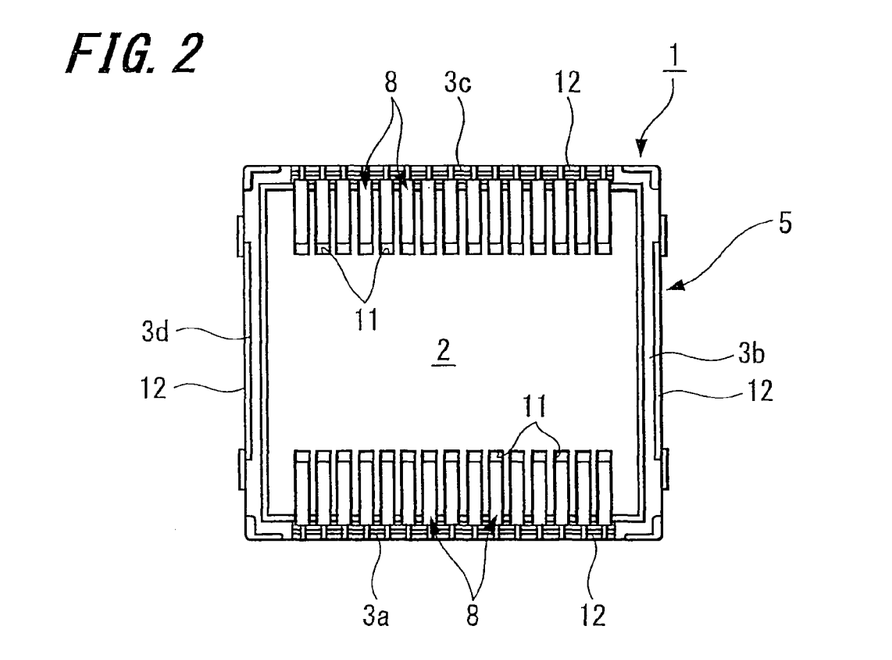
FIG. 2 is a back view of the socket of the example according to the embodiment of the present invention.
Figure 3:
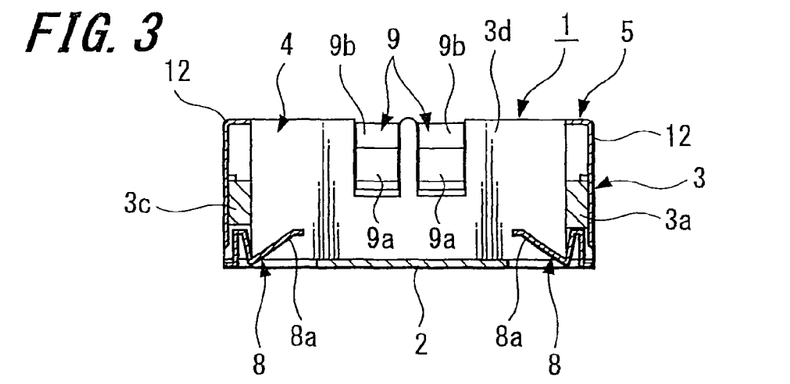
FIG. 3 is a cross section along an A-A' line of FIG. 1.
Figure 4:
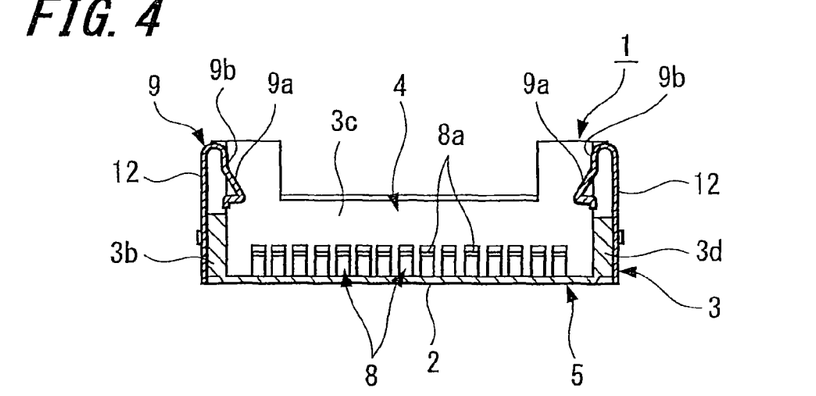
FIG. 4 is a cross section along a B-B' line of FIG. 1.

FIG. 1 through FIG. 4 illustrates an example of a socket for mounting an electronic component according to an embodiment of the present invention. FIG. 1 is a front view of the socket for mounting an electronic component of the example according the present embodiment. FIG. 2 is a back view of the socket. FIG. 3 is a cross section along an A-A' line of FIG. 1. FIG. 4 is a cross section along a B-B' line of FIG. 1.

Figure 5:
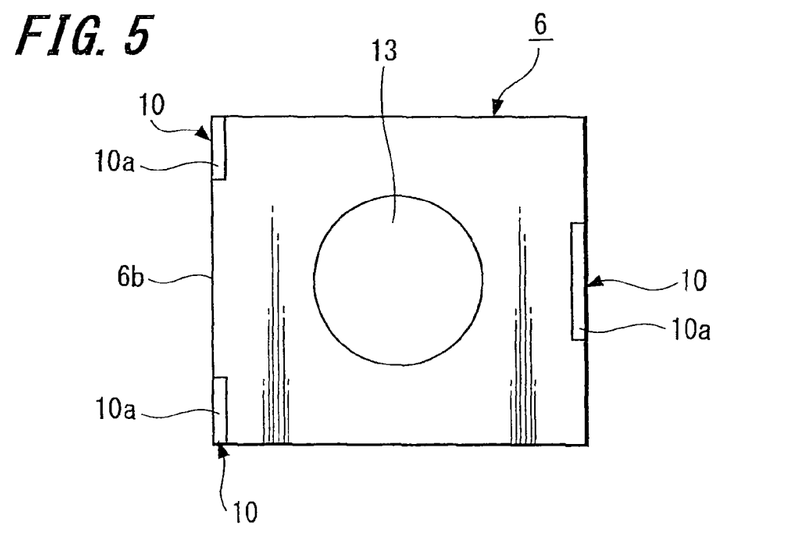
FIG. 5 is a front view illustrating an example of an electronic component such as a camera module, etc. that is inserted into the socket for mounting an electronic component of the example according to the embodiment of the present invention.
Figure 6:
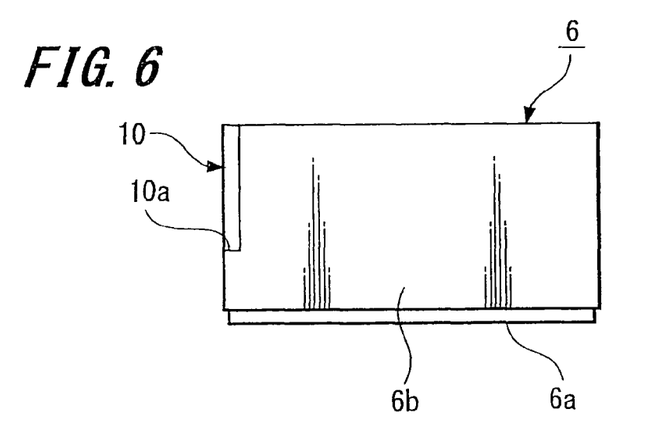
FIG. 6 is a bottom view of FIG. 5.
Figure 7:
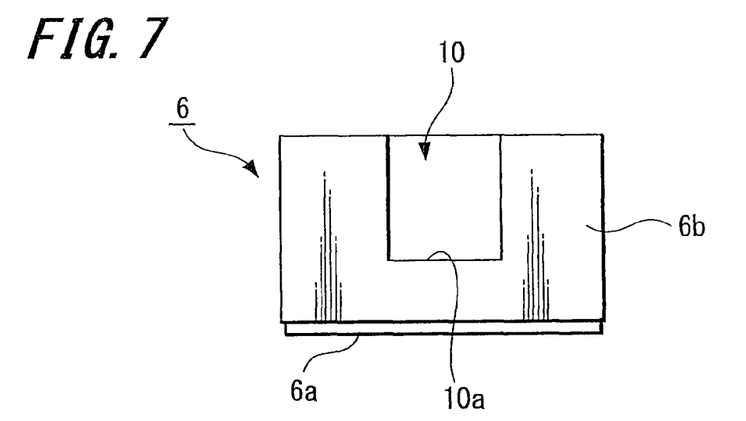
FIG. 7 is a right side view of FIG. 5.
Figure 8:
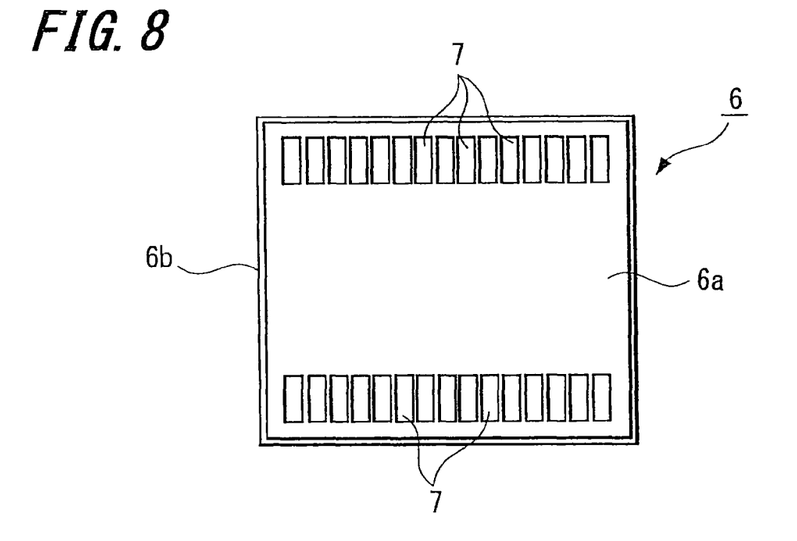
FIG. 8 is a back view of FIG. 5.

FIG. 5 through FIG. 8 illustrates an example of an electronic component, such as a cameral module, etc., that is inserted into the socket for mounting an electronic component of the example according to the present embodiment. FIG. 5 is a front view of the electronic component, FIG. 6 is a bottom view of FIG. 5, FIG. 7 is a right side view of FIG. 5, and FIG. 8 is a back view of FIG. 5.

Figure 9:
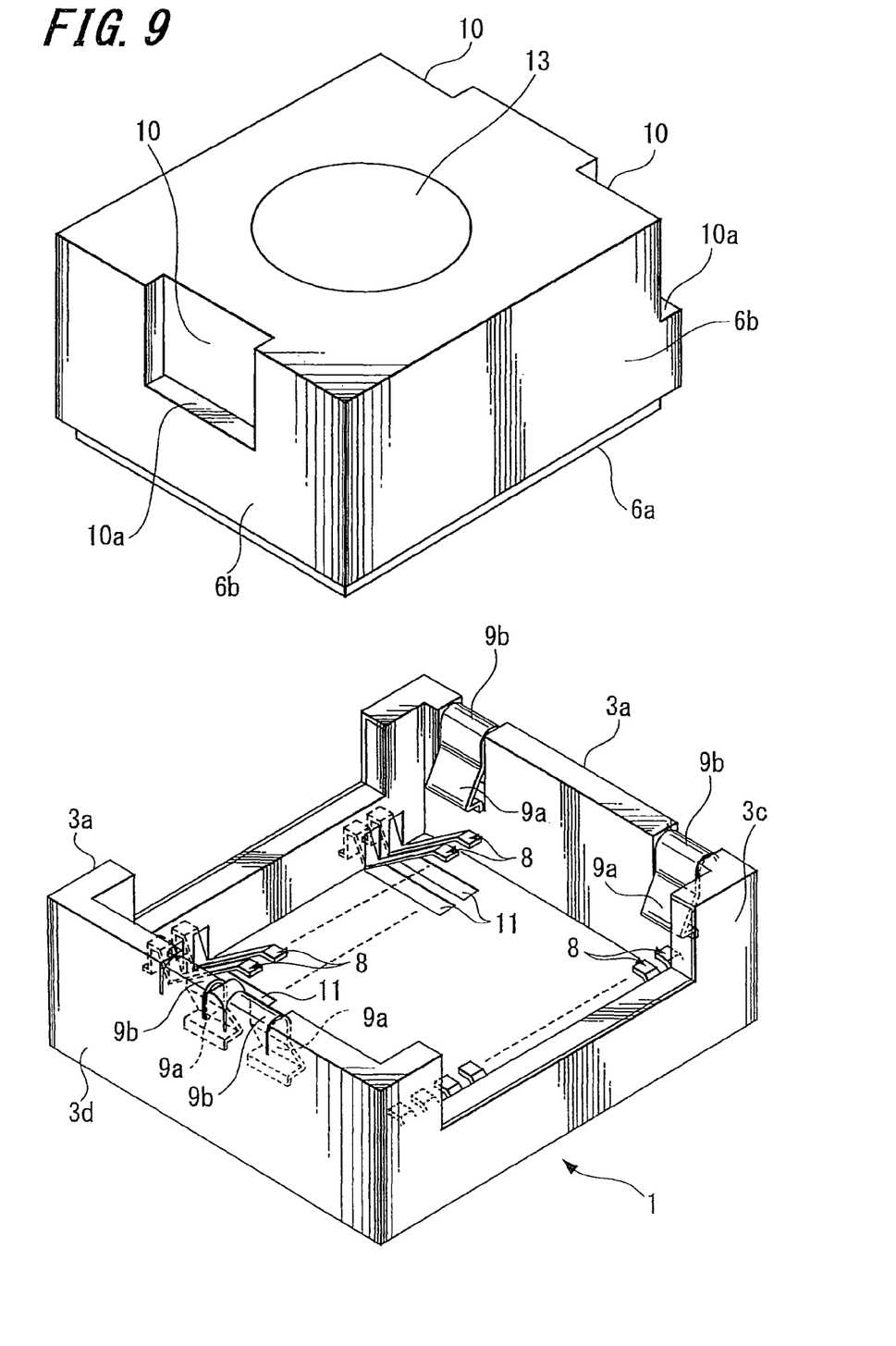
FIG. 9 is a perspective view illustrating the socket for mounting an electronic component of the example according to the embodiment of the present invention and an example of an electronic component that is inserted into the socket.

FIG. 9 is a perspective view illustrating an example of a state that the electronic component illustrated in FIG. 5 through FIG. 8 is inserted into the socket for mounting an electronic component illustrated in FIG. 1 through FIG. 4. As illustrated in the front view of FIG. 5, in an electronic component (camera module) 6, a lens part 13 is mounted to the upper surface, so that it is necessary to mount the electronic component 6 to a socket for mounting an electronic component 1 in a correct positional relationship.

The socket for mounting an electronic component 1 of the present example includes a socket housing 5 having an electronic component accommodating part 4 surrounded by a peripheral wall 3 constituted of four side parts 3a, 3b, 3c, 3d raised from the four side parts at the periphery of a quadrangle-shape bottom plate 2. Further, the socket for mounting an electronic component 1 includes a plurality of contacts 8 protruding from the bottom plate 2 of the socket housing 5. The plurality of contacts 8 include elastic contact pieces 8a. The elastic contact pieces 8a elastically contact and are electrically connected to a plurality of terminal parts 7 in a bottom part 6a of the electronic component 6 in the electronic component accommodating part 4.

Then, socket-side engaging parts 9 that are provided at a plurality of places of the peripheral wall 3 of the socket housing 5 and formed inside of the electronic component accommodating part 4 and electronic-component-side engaging parts 10 that are provided in a peripheral wall 6b of the electronic component 6 are engaged, respectively. Due to the socket-side engaging parts 9 with such configuration, the electronic component 6 is held within the electronic component accommodating part 4.

The socket housing 5 includes the quadrangle-shape bottom plate 2 formed in a flat plate shape and the peripheral wall 3 of the four side parts 3a, 3b, 3c, 3d raised from the four side parts of the bottom plate 2. In the socket housing 5, the electronic component accommodating part 4 surrounded by the bottom plate 2 and the peripheral wall 3 of the four side parts 3a, 3b, 3c, 3d is formed.

In the bottom plate 2, a plurality of slit-like penetrating holes 11 are formed, in parallel to each other, from opposing two side parts of the four side parts toward respective opposing side parts. The elastic contact pieces 8a move up and down while fitting in these penetrating holes 11.

The outer circumferences of the four side parts 3a, 3b, 3c, 3d of the peripheral wall 3 are covered by a shield plate 12 made of conductive material. The socket-side engaging parts 9 may be electrically connected to the shield plate 12, and the side surfaces of the electronic component 6 mounted to the electronic component accommodating part 4 may be configured such that the electric potential thereof is equal to that of the shield plate 12 (ground potential).

The socket-side engaging parts 9 have fixing protrusions 9a and elastic fixing pieces 9b. The elastic fixing pieces 9b protrude to the inside of the electronic component accommodating part 4, respectively, and the fixing protrusions 9a at the tip ends are locked in bottom parts 10a of the electronic-component-side engaging parts 10, formed in a recessed shape in the peripheral wall 6b of the electronic component 6. The electronic-component-side engaging parts 10 of the peripheral wall 6b of the electronic component 6 are arranged in two opposing surfaces as illustrated in FIG. 5. In one surface of the two surfaces where the electronic-component-side engaging parts 10 are arranged, the engaging part 10 is arranged in one place, at the center, and in the other surface, the engaging part 10 is arranged in two places, at the left corner and the right corner. The engaging part 10 at the center of one surface engages with two socket-side engaging parts 9, and therefore, the engaging part 10 is made as a large wide engaging part. The engaging parts 10 at the right and left corners of the other surface engage with the socket-side engaging parts 9, respectively, so that each of the engaging parts 10 is made as a small narrow engaging part.

Two socket-side engaging parts 9 are provided in each of opposing two side parts 3b, 3d of the peripheral wall 3 of the four side parts 3a, 3b, 3c, 3d of the socket housing 5, in non-symmetrical arrangement. In the one side part 3d of the two side parts 3b, 3d, a plurality of the socket-side engaging parts 9 are arranged closer to the both end sides thereof with an interval in between, and in the other side part 3b, a plurality of the socket-side engaging parts 9 are arranged closer to the center side thereof adjacent to each other.

In the present example, the number of the plurality of socket-side engaging parts 9 that are arranged with an interval in between in the one side part 3d of the opposing two side parts 3b, 3d of the peripheral wall 3 is two. Also, the number of the plurality of socket-side engaging parts 9 that are arranged closer to the center side adjacent to each other in the other side part 3b of the opposing two side parts 3b, 3d of the peripheral wall 3 is two.

Thus, in the one side part 3d of the opposing two side parts 3b, 3d of the peripheral wall 3 of the four side parts 3a, 3b, 3c, 3d of the socket housing 5, a plurality of the socket-side engaging parts 9 are arranged closer to the both end sides thereof with an interval in between. In the remaining other side part 3b, a plurality of the socket-side engaging parts 9 are arranged closer to the center side thereof adjacent to each other. Accordingly, only when the electronic component 6 is inserted into the electronic component accommodating part 4 in the correct orientation, the bottom parts 10a of the electronic-component-side engaging parts 10 are depressed by respective socket-side engaging parts 9 and thereby locking is effected. Otherwise, locking will not be effected, and the electronic component 6 will be pushed out by the elasticity of the elastic contact pieces 8a of the plurality of contacts 8 and it will be known that insertion was made in the wrong orientation. Therefore, according to the example of the present embodiment, it is possible to insert the electronic component 6 into the socket for mounting an electronic component 1 always in the correct orientation to be electrically connected.

In particular, if the number of the plurality of socket-side engaging parts 9 arranged with an interval in between in the one side part 3d of the opposing two side parts 3b, 3d of the peripheral wall 3 is two and the number of the plurality of socket-side engaging parts 9 arranged closer to the center side adjacent to each other in the other side part 3b of the two opposing side parts 3b, 3d of the peripheral wall 3 is two, the arrangement of respective socket-side engaging parts 9 becomes substantially in a triangle arrangement, and it is possible to lock the electronic component 6 in a stable posture.

Note that the number of the socket-side engaging parts 9 arranged in the one side part 3d with an interval in between is not limited to two, and the number may be other ones, for example, three, etc., and also, the number of the socket-side engaging parts 9 arranged in the other side part 3b adjacent to each other is not limited to two, and the number may be one or three. Further, the opposing two side parts in the peripheral wall 3 of the four side parts 3a, 3b, 3c, 3d, in which the socket-side engaging parts 9 are arranged, may be the other two side parts 3a, 3c.

Figure 10:
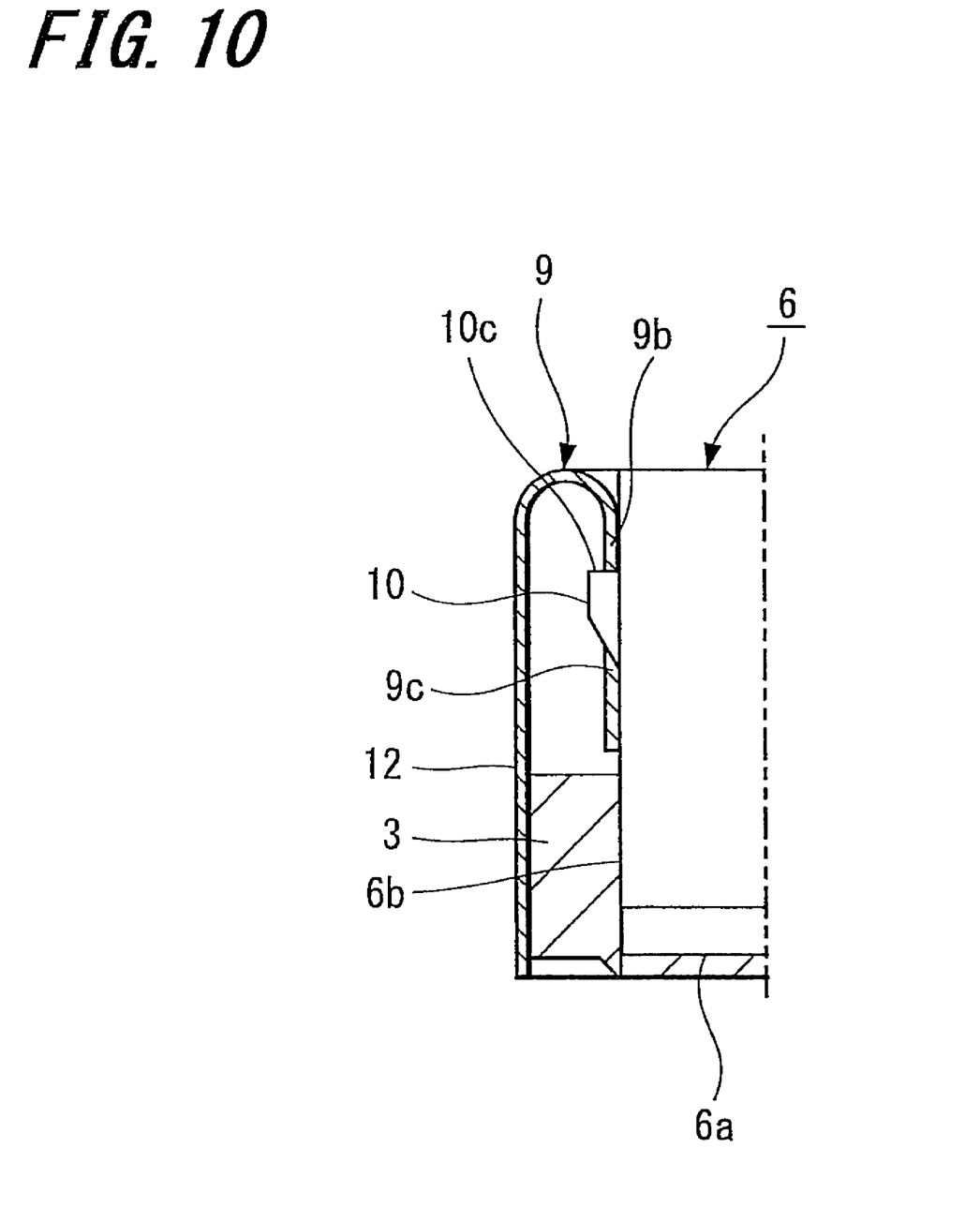
FIG. 10 is a cross section illustrating an example of a socket for mounting an electronic component according to another embodiment of the present invention.

Further, as long as the electronic component 6 is stably locked, the engagement shape of the socket-side engaging parts 9 and the electronic-component-side engaging parts 10 is not limited to the one shown in FIG. 1. For example, as the engagement state is shown in FIG. 10 by the cross section, the socket-side engaging part 9 may have the configuration that the elastic fixing piece 9b and a locking hole 9c are provided within the electronic component accommodating part 4. Then, the electronic-component-side engaging part 10 of the peripheral wall 6b of the electronic component 6 is shaped to include a locking protrusion 10c that is inserted and locked in the locking hole 9c. The electronic-component-side engaging part 10 may have the configuration shown in FIG. 10. The arrangement positions of the engaging parts 9 and 10 may be the same, for example, as those of the example of FIG. 1.

EXPLANATION OF REFERENCE NUMERALS

1: socket for mounting an electronic component, 2: bottom plate, 3: peripheral wall, 3a, 3b, 3c, 3d: side parts, 4: electronic component accommodating part, 5: socket housing, 6: electronic component accommodating part, 6a: bottom part, 6b: peripheral wall, 7: terminal part, 8: contact, 8a: elastic contact piece, 9: socket-side engaging part, 9a: fixing protrusion, 9b: elastic fixing piece, 9c: locking hole, 10: electronic-component-side engaging part, 10a: bottom part, 10c: locking protrusion, 11: penetrating hole, 12: shield plate, 13: lens part

The invention claimed is:

1. A socket for mounting an electronic component, comprising:
   a socket housing including an electronic component accommodating part that is surrounded by a peripheral wall raised from four side parts of a quadrangle-shape bottom plate;
   a plurality of contacts protruding from the bottom plate of the socket housing and including elastic contact pieces that elastically contact a plurality of terminal parts in a bottom part of an electronic component in the electronic component accommodating part which is electrically connectable to the socket housing; and
   socket-side engaging parts provided at a plurality of places on the peripheral wall of the socket housing,
   wherein the socket-side engaging parts protrude from the peripheral wall of the socket housing to engage with electronic-component-side engaging parts of an electronic component insertable into the electronic component accommodating part to prevent coming-off of the electronic component,
   wherein the socket-side engaging parts engage with the electronic-component-side engaging parts to thereby prevent the electronic component from coming off the inside of the electronic component accommodating part, and
   wherein one or plural socket-side engaging parts of the socket-side engaging parts are arranged in each of two opposing side parts of the peripheral wall of the four side parts of the socket housing in positions that are not symmetrical with respect to a center of the electronic component accommodating part of the socket housing such that, in one side part of the two opposing side parts of the peripheral wall of the four side parts of the socket housing, plural socket-side engaging parts are arranged closer to both end sides thereof than to a center side thereof, with an interval in between the plural socket-side engaging parts, and in the remaining other side part, one or plural socket-side engaging parts are arranged closer to a center side thereof than to end sides thereof, and thereby, when the electronic component is inserted in a direction other than a specified orientation, the socket-side engaging parts are not matched to the electronic-component-side engaging parts.

2. The socket for mounting an electronic component according to claim 1, wherein the number of the plural socket-side engaging parts arranged closer to the both end sides than to the center side in one side part of the two opposing side parts of the peripheral wall is two, and the number of the plural socket-side engaging parts arranged closer to the center side than to the end sides in the other side part of the two opposing side parts is two.

3. The socket for mounting an electronic component according to claim 1, wherein the electronic-component-side engaging parts of the peripheral wall of the electronic component are locking recessed parts in a shape made by recessing the peripheral wall, and the socket-side engaging parts are elastic fixing pieces that are provided in the peripheral wall of the socket housing, the socket-side engaging parts protrude to the inside of the electronic component accommodating part, respectively, and fixing protrusions at the tip ends of the socket-side engaging parts are locked in the locking recessed parts of the peripheral wall of the electronic component.

4. The socket for mounting an electronic component according to claim 1, wherein the peripheral wall of the socket housing is covered by an electrically conductive shield plate and the socket-side engaging parts are electrically connected to the electrically conductive shield plate to electrically ground the electronic component to the shield plate when the electronic component is inserted into the socket housing and the socket-side engaging parts are engaged with the electronic-component-side engaging parts.

5. The socket for mounting an electronic component according to claim 1, wherein the socket-side engaging parts are ratchet-shaped.

6. The socket for mounting an electronic component according to claim 1, wherein each of the socket-side engaging parts comprise a tapered surface that faces inward into the electronic component accommodating part.

7. The socket for mounting an electronic component according to claim 6, wherein each of the socket-side engaging parts further comprise a locking surface that faces the quadrangle-shape bottom plate and is substantially parallel to the quadrangle-shape bottom plate, the locking surface being located at an end of the tapered surface nearest to the quadrangle-shape bottom plate.

8. The socket for mounting an electronic component according to claim 1, wherein the electronic component is pushed out from the electronic component accommodating part by elasticity of the elastic contact pieces that elastically contact the plurality of terminal parts in the bottom of the electronic component.

* * * * *